United States Patent [19]

Poteet

[11] Patent Number: 4,555,777

[45] Date of Patent: Nov. 26, 1985

[54] SENSE AMPLIFIER CIRCUIT FOR DYNAMIC READ/WRITE MEMORY

[75] Inventor: Ken A. Poteet, Houston, Tex.

[73] Assignee: Texas Instruments Incorporated, Dallas, Tex.

[21] Appl. No.: 640,715

[22] Filed: Aug. 14, 1984

[51] Int. Cl.⁴ .......................... G11C 7/00; G11C 11/24
[52] U.S. Cl. ...................................... 365/205; 365/210
[58] Field of Search ................ 365/205, 203, 210, 222

[56] References Cited

U.S. PATENT DOCUMENTS 4,239,993  12/1980  McAlexander, III .............. 365/205
4,386,419  5/1983   Yamamoto ......................... 365/203

OTHER PUBLICATIONS

IBM Technical Disclosure Bulletin—vol. 25, No. 10, Mar. 1983, pp. 5088–5091.

Primary Examiner—James W. Moffitt
Attorney, Agent, or Firm—John G. Graham

[57] ABSTRACT

A semiconductor dynamic read/write memory device using one-transistor storage cells and balanced bit lines employs a differential sense amplifier having dual sets of transistors for both the N-channel and P-channel transistor pairs in a CMOS flip-flop circuit. One set of P and N channel transistors is cross-coupled in the conventional manner, and the other set is cross-coupled by way of series transistors which are shut off for write operations, bypassing static loads for write.

14 Claims, 3 Drawing Figures

SENSE AMPLIFIER CIRCUIT FOR DYNAMIC READ/WRITE MEMORY

BACKGROUND OF THE INVENTION

This invention relates to semiconductor memory devices, and more particularly to an improved sense amplifier circuit for use in dynamic memory devices.

Dynamic MOS read/write memory devices using N-channel circuits have been constructed generally as shown in U.S. Pat. No. 3,940,747 (a 4K dynamic RAM) issued to Kuo, U.S. Pat. No. 4,081,701 (a 16K dynamic RAM) issued to White, McAdams and Redwine, or U.S. Pat. No. 4,239,993 (a 64K dynamic RAM) issued to McAlexander, White and Rao, all assigned to Texas Instruments.

In these and other prior devices a differential sense amplifier circuit was used to detect the data bit stored in a cell capacitor, and to write into or restore the data in the cells. In a typical write operation, the data on the bit lines and sense amplifier output may have to be switched from a full rail-to-rail condition one way to full rail-to-rail the other way. Usually intermediate buffers are employed which are capable of writing opposite data to the columns, and these buffers must use large transistors in order to reduce the write cycle timing.

It is the principal object of this invention to provide improved sense amplifier circuitry for high density dynamic RAM devices, particularly for high speed write operations. Another object is to provide sense amplifier circuitry for a dynamic RAM in which data can be written to the the bit lines at high speed without requiring large driver transistors in an intermediate buffer.

SUMMARY OF THE INVENTION

In accordance with one embodiment of the invention, a semiconductor dynamic read/write memory circuit using one-transistor storage cells and balanced bit lines employs a differential sense amplifier having dual sets of transistors for both the N-channel and P-channel transistor pairs in a CMOS flip-flop circuit. One set of P and N channel transistors is cross-coupled in the conventional manner, and the other set is cross-coupled by way of series transistors which are shut off for write operations, by passing static loads for write.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF SPECIFIC EMBODIMENT

Figure 1:
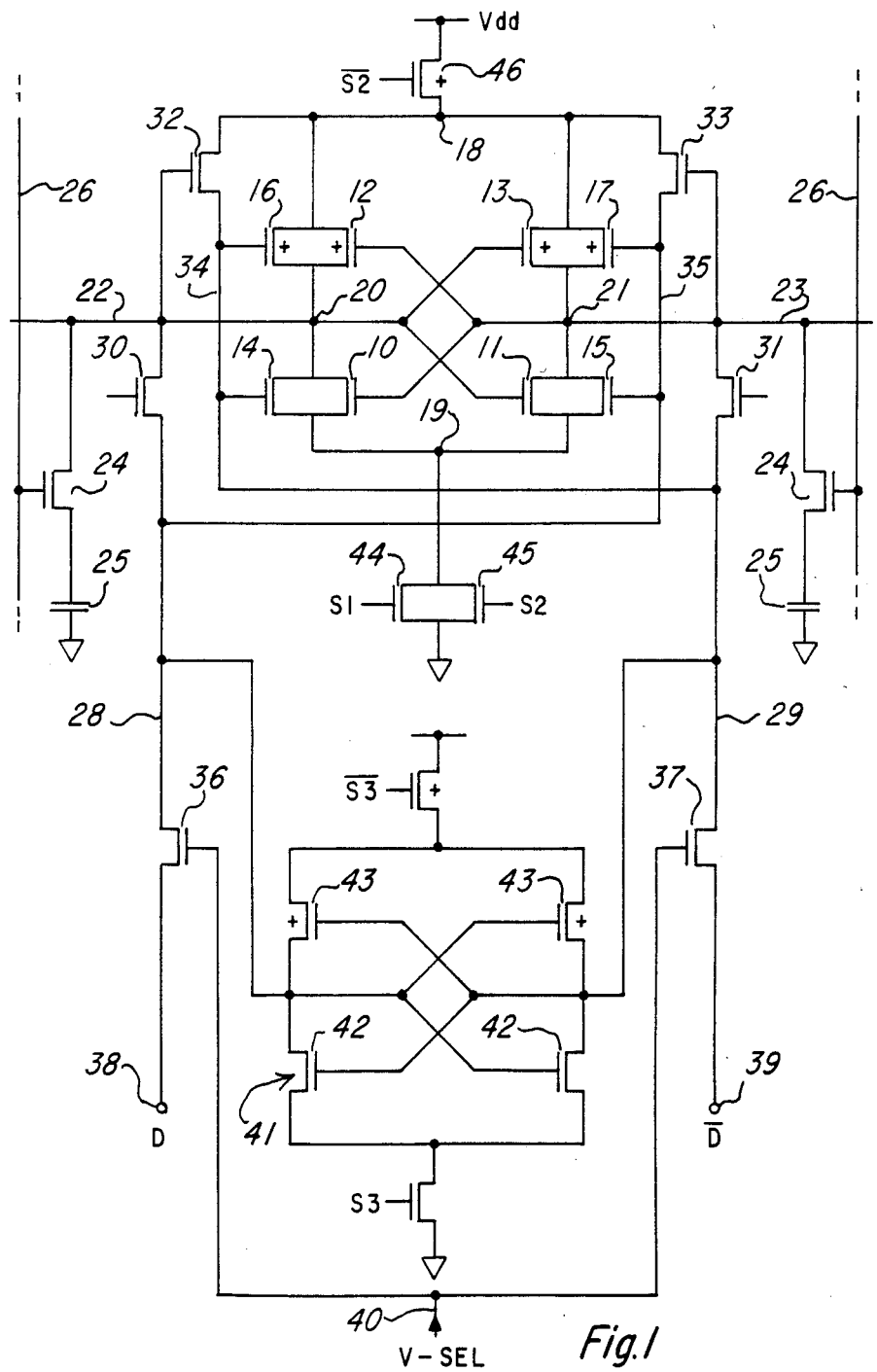
FIG. 1 is an electrical schematic diagram of a sense amplifier circuit for a dynamic RAM constructed according to the invention.

With reference to FIG. 1, a CMOS sense amplifier for a dynamic RAM is illustrated according to the invention. The sense amplifier consists of a cross-coupled flip-flop circuit having a pair of N-channel driver transistors 10 and 11, with P-channel load or pull-up transistors 12 and 13. The N-channel transistors 10 and 11 have parallel N-channel transistors 14 and 15, and likewise parallel P-channel transistors 16 and 17 are connected across the transistors 12 and 13. These sets of dual transistors are connected between a node 18 on the high side and a grounding node 19 on the low side. The gates of transistors 10, 11, 12 and 13 are cross-coupled to sense nodes 20 and 21 in the usual manner.

Balanced bit lines 22 and 23 are connected to the sense nodes 20 and 21. Memory cells coupled to the bit lines 22 and 23 consist of access transistors 24 and storage capacitors 25. There may be, for example, sixty-four or 128 of these cells on each bit line, and perhaps 256 or 512 or more of the sense amplifier circuits would be used in a single memory device. Word lines 26 activated by a row decoder select one of the memoy cells for each pair of bit lines. A dummy cell of standard construction (not shown) is connected to the opposite bit line.

The bit lines 22 and 23 are connected to data I/O lines 28 and 29 through transistors 30 and 31, and the source-drain paths of these transistors 30 and 31 are also in the cross-coupling paths between sense nodes 20, 21 and the gates of transistors 14–17. The bit lines are also connected to gates of P-channel transitors 32 and 33 having source-to-drain paths coupled between the node 18 and gate nodes 34 and 35 for transistors 14, 15, 16 and 17; these gate nodes 34 and 35 are cross-coupled to the I/O lines 28 and 29.

The I/O lines 28 and 29 are coupled through Y-select transistors 36 and 37 to data and data-bar lines 38 and 39. The gates of the transistors 36 and 37 are connected to a node 40 which is one output of a column decoder for the memory device. If there are 256 sense amplifiers for the array, then the Y decoder selects one of 256, turning on only one pair of transistors 36,37 via the node 40. An intermediate output buffer 41 is connected to the I/O lines 28 and 29, functioning to amplify the signal on these lines, reducing the loading of the sense amplifier. The I/O buffer 41 is of standard construction; for example, it may be a CMOS flip-flop having N-channel transistors 42 and P-channel transistors 43. The I/O lines 28 and 29 are equalized at Vdd/2 through transistors 30 and 31 for initial sensing.

Figure 2:
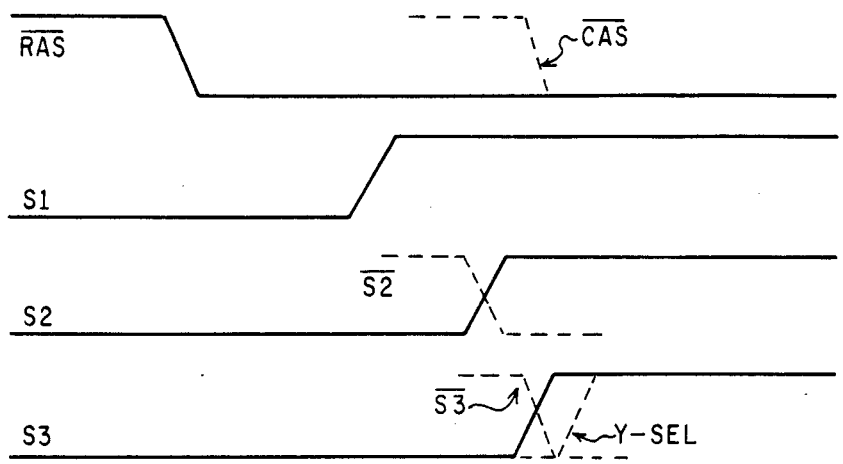
FIGS. 2 and 3 are a timing diagrams showing plots of voltage vs. time for nodes in the circuit of FIG. 1, for read and write operations.

The sense amplifier is activated by a pair of transistors 44 and 45 connecting the node 19 to ground. The transistor 44, smaller than the transistor 45, has sense clock S1 on its gate as seen in FIG. 2. The larger transistor 45 has the delayed sense clock S2 on its gate. When S2 goes high, its complement $\overline{S2}$ goes low and connects the node 18 to Vdd through P-channel transistor 46.

In a read cycle as illustrated in FIG. 2, the initial period before $\overline{RAS}$ drops is a precharge cycle. The bit lines 22 and 23 are precharged and equallized to Vdd/2 by precharge transistors, not shown, in accord with the usual practice. The I/O lines 18 and 19 are isolated from Vdd or Vss at this point since S1 and S2 are at zero volts and $\overline{S2}$ is at Vdd. Shortly after $\overline{RAS}$ drops, one of the word lines 26 goes high, selected by the row decoder, and a storage capacitor 25 is coupled to a bit line 22 or 23, with a dummy cell being coupled to the opposite bit line. The bit lines separate slightly, but the sense amplifier transistors 10–17 do not function yet because the nodes 18 and 19 are still isolated from Vdd and Vss. The transistors 32 and 33 are held in the off condition by the precharge voltage on the bit lines, so nodes 34 and 35 follow the bit lines (i.e., stay at about Vdd/2), since transistors 30 and 31 are on (the voltage $\overline{WBS}$ stays high during an entire read cycle). The sets of transistors 14,15 and 16,17 in parallel with the main latch transistors function just like the main transistors 10-13 in a read operation since the transistors 30 and 31 are on and so the cross-coupling to the opposite sense nodes is the same.

When S1 goes high in the read operation, providing a high resistance path to ground, the N-channel transistors 10 and 11 begin to function at low gain and the bit lines separate further due to the cross-coupled flip-flop operation. The transistors 32 and 33 do not turn on yet because neither bit line is pulled down to the P-channel threshold level Vtp. When S2 goes high, and S2 drops, the bit lines are forced to a full rail-to-rail one and zero as the large transistors 45 and 46 turn on. When one bit line 22 or 23 is pulled to near zero (below Vtp) one of the transistors 32 or 33 is turned on, pulling the opposite I/O line 28 or 29 and this bit line high; also, the N-channel transistor 14 or 15 on the zero-going side is turned on full at this point to aid in pulling the zero side low. The transistors 14 and 15 are larger than their parallel transistors 10 and 11; likewise the P-channel transistors 16 and 17 are larger than their parallel transistors 12 and 13 (by larger is meant that the channel width is greater, for a given channel length).

The I/O buffer 41 is activated by S3 and S3 just after S2 goes high, i.e., after a full rail-to-rail signal is available at the bit lines. Then, the Y-sel voltage goes high just after S3 goes low, so the output data is available on the lines 38 and 39. The purpose of the I/O buffer 41 in this case is to drive the capacitance of the data/data-bar lines 38 and 39.

Figure 3:
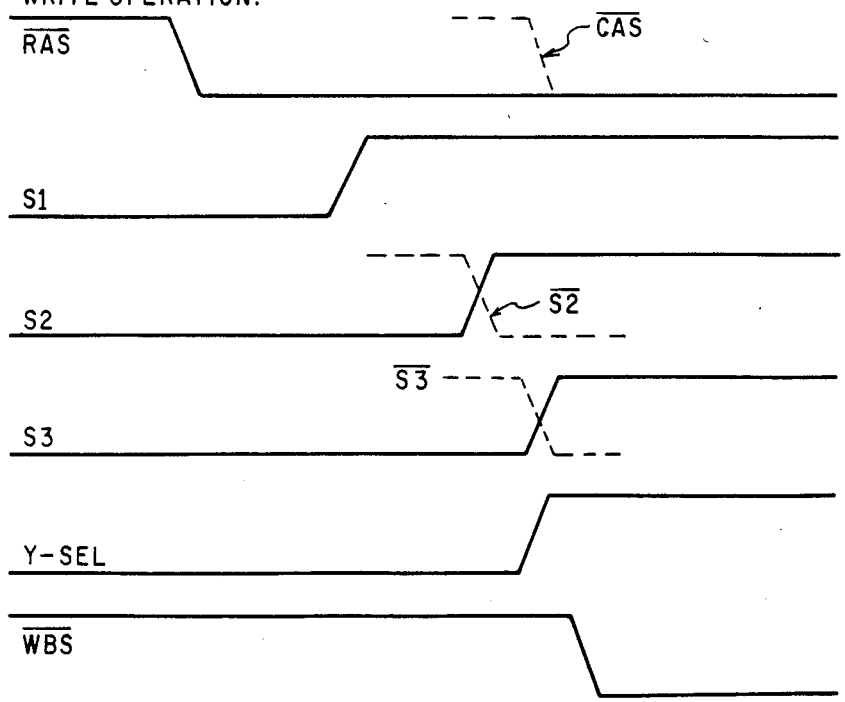

In a write operation, a read preceeds the write because a refresh is implemented for an entire row, but a data bit is written to only one of a few of the columns of the addressed row. As seen in FIG. 3, the sense clocks S1, S2 and $\overline{S2}$ are activated after $\overline{RAS}$ drops, just as in a read, so the bit lines 22 and 23 are driven to a full rail-to-rail condition based on the data bit in the addressed cell, before writing the incoming data bit. After $\overline{CAS}$ drops, the read/write control R/$\overline{W}$ drops, and the Y-sel voltage for the selected column goes high. The I/O buffer is then activated by S3 going high, and the transistors 30 and 31 are cut off by the $\overline{WBS}$ voltage going low. This causes the incoming data bit and its complement on lines 28 and 29 to drive only the gates of the transistors 14, 15, 16 and 17, rather than driving the bit lines 22 and 23. The CMOS latch is thus forced in the direction dictated by the data on lines 28, 29, because the transistors 14-17 are larger than the transistors 10-13. There is no current drain on the I/O buffer 41 because the large capacitance of the bit lines is charged or discharged through the sense amplifier transistors rather than from the I/O buffer.

While this invention has been described with reference to an illustrative embodiment, this description is not intended to be construed in a limiting sense. Various modifications to the illustrative embodiment, as well as other embodiments of the invention, will be apparent to persons skilled in the art upon reference to this description. It is therefore contemplated that the appended claims will cover any such modifications or embodiments as fall within the true scope of the invention.

What is claimed:

1. A semiconductor memory device comprising:
 (a) an array of rows and columns of storage cells,
 (b) addressing means for activating one of said rows of storage cells at a first time in an operating cycle,
 (c) each column having a sense amplifier including first and second sense nodes connected to a pair of bit lines, the bit lines being coupled to storage cells of a column,
 (d) each of said sense amplifiers comprising:
  a CMOS cross-coupled flip-flop circuit having first and second N-channel transistors and first and second P-channel transistors, each of said transistors having a source-to-drain path and a gate, the source-to-drain paths of the first and second N-channel transistors being separately connected between said first and second sense nodes and grounding means, the source-to-drain paths of the first and second P-channel transistors being separately connected between said first and second sense nodes and voltage supply means,
  third and fourth N-channel transistors and third and fourth P-channel transistors, each of said transistors having a source-to-drain path and a gate, the source-to-drain paths of said third and fourth N-channel transistors being separately connected across the source-to-drain paths of the first and second N-channel transistors, the source-to-drain paths of the third and fourth P-channel transistors being separately connected across the source-to-drain paths of the first and second P-channel transistors,
  first and second coupling transistors, each having a source-to-drain path and a gate, the source-to-drain path of the first coupling transistor connecting said gates of the third N-channel and third P-channel tranistors to said second sense node, the source-to-drain path of said second coupling transistor connecting said gates of the fourth N-channel and fourth P-channel transistors to said first sense node,
  and means for activating the gates of said first and second coupling transistors during a read operation, and deactivating such gates during a write operation.

2. A device according to claim 1 wherein said storage cells are one-transistor dynamic memory cells.

3. A device according to claim 1 wherein said third and fourth N-channel transistors are larger than said first and second N-channel transistors.

4. A device according to claim 3 wherein said third and fourth P-channel transistors are larger than said first and second P-channel transistors.

5. A device according to claim 4 including a pair of data I/O lines for each of said sense amplifiers, and means connecting said data I/O lines to said first and second sense nodes through the source-to-drain paths of said first and second coupling transistors.

6. A device according to claim 5 including fifth and sixth P-channel transistors, each having a source-to-drain path and a gate; the source-to-drain paths of said fifth and sixth P-channel transistors separately connecting said pair of data I/O lines to said voltage supply means, the gates of said fifth and sixth P-channel transistors separately connected to the first and second sense nodes.

7. A sense amplifier for a dynamic memory device, comprising:
 a CMOS cross-coupled flip-flop circuit having first and second N-channel transistors and first and second P-channel transistors, each of said transistors having a source-to-drain path and a gate, the source-to-drain paths of the first and second N-channel transistors being separately connected between first and second sense nodes and grounding means, the source-to-drain paths of the first and second P-channel transistors being separately connected between said first and second sense nodes and voltage supply means, third and fourth N-channel transistors and third and fourth P-channel transistors, each of said transistors having a source-to-drain path and a gate, the source-to-drain paths of said third and fourth N-channel transistors being separately connected across the source-to-drain paths of the first and second N-channel transistors, the source-to-drain paths of the third and fourth P-channel transistors being separately connected across the source-to-drain paths of the first and second P-channel transistors, first and second coupling transistors, each having a source-to-drain path and a gate, the source-to-drain path of the first coupling transistor connecting said first sense node to a first data I/O line and to said gates of the fourth N-channel and fourth P-channel transistors, the source-to-drain path of said second coupling transistor connecting said second sense node to a second data I/O line and to said gates of the third N-channel and third P-channel transistors, and means for activating the gates of said first and second coupling transistors during a read operation, and deactivating such gates during a write operation.

8. A device according to claim 7 wherein said third and fourth N-channel transistors are larger than said first and second N-channel transistors.

9. A device according to claim 8 wherein said third and fourth P-channel transistors are larger than said first and second P-channel transistors.

10. A device according to claim 7 including fifth and sixth P-channel transistors, each having a source-to-drain path and a gate; the source-to-drain paths of said fifth and sixth P-channel transistors separately connecting said first and second data I/O lines to said voltage supply means, the gates of said fifth and sixth P-channel transistors separately connected to the first and second sense nodes.

11. A device according to claim 9 including a bit line with a plurality of memory cells connected to each said sense node.

12. A method of operating a memory device of the type having a cross-coupled latch circuit in a sense amplifier, the cross-coupled latch circuit having a pair of sense nodes each coupled to a bit line having a plurality of storage cells thereon, comprising the steps of:

activating said cross-coupled latch for a read operation and coupling a pair of data I/O lines to said bit lines to read the data directly from the bit lines, activating said cross-coupled latch and then coupling said pair of data I/O lines only to the control gates of transistors in said cross-coupled latch and not to the bit lines during a write operation, so that data is not written directly to the bit lines from the data I/O lines but instead is written through the operation of the cross-coupled latch.

13. A method according to claim 12 wherein said step of activating said cross-coupled latch for a read or write operation includes the step of coupling a first common node to ground and coupling a second common node to a positive voltage supply.

14. A method according to claim 13 wherein said cross-coupled latch includes a pair of N-channel transistors and a pair of P-channel transistors.

* * * * *